United States Patent [19]

Tanno et al.

[11] Patent Number: 4,612,099
[45] Date of Patent: Sep. 16, 1986

[54] REACTIVE ION ETCHING METHOD

[75] Inventors: Masuo Tanno, Osaka; Yuichiro Yamada, Neyagawa, both of Japan

[73] Assignee: Matsushita Electric Industrial Co., Ltd., Osaka, Japan

[21] Appl. No.: 629,596

[22] Filed: Jul. 11, 1984

[30] Foreign Application Priority Data

Jul. 12, 1983 [JP] Japan .................. 58-126518

[51] Int. Cl.4 ............... H01L 21/306; C23C 15/00
[52] U.S. Cl. ..................... 204/192.32; 156/643; 156/646; 204/192.35; 502/262
[58] Field of Search ............... 204/192 E, 192 EC; 156/643, 646, 345; 423/500; 502/262; 570/257

[56] References Cited

U.S. PATENT DOCUMENTS

| | | | |
|---|---|---|---|
| 1,930,350 | 10/1933 | Strosacker et al. | 570/257 X |
| 3,864,281 | 2/1975 | Ohorodnik et al. | 502/262 X |
| 4,169,815 | 10/1979 | Drehman | 502/262 X |
| 4,240,933 | 12/1980 | Copelin | 502/262 X |
| 4,380,488 | 4/1983 | Reichelderfer et al. | 204/192 E X |
| 4,442,338 | 4/1984 | Yamazaki | 156/345 X |

Primary Examiner—John F. Niebling
Assistant Examiner—Nam X. Nguyen
Attorney, Agent, or Firm—Wenderoth, Lind & Ponack

[57] ABSTRACT

According to the present invention, there is used a usual reactive ion etching apparatus (as shown in FIG. 1) including a vacuum vessel (1), exhaust means (2), etching gas supply means (4), plasma generating electrodes (6) and high frequency power supply (7). Substance having a catalytic action (8) is inserted in the etching gas supply means (4), by which the present invention is characterized. According to the present invention, a catalyst having an action of dehydrogenation, dehydrohalogenation or dehalogenation dependent on the molecular structure of a halogenized gas to be used, is inserted in the etching gas supply means in the path thereof, thereby to improve the etching speed and the etching selectively without the use of explosive or injurious gases such as hydrogen, chlorine, hydrogen chloride or hydrogen fluoride as additive gases.

7 Claims, 2 Drawing Figures

4,612,099

REACTIVE ION ETCHING METHOD

TECHNICAL FIELD

The present invention relates to a reactive ion etching method for processing inorganic and organic substances in manufacture of electronic parts such as semiconductors. The present invention provides a reactive ion etching method of such type in which the etching speed and the etching slectivity can be improved without the use of explosive or injurious additive gases such as hydrogen, chlorine, hydrogen chloride, and hydrogen fluoride.

BACKGROUND ART

According to a conventional reactive ion etching method, with the use of a simple halogenized gas as an etching gas electric discharge has been made for processing inorganic and organic substances by ions, radicals, etc. in plasma. However, due to its low etching speed or unsatisfactory etching uniformity, there has been recently developed a new reactive ion etching method in which additive gases are mixed with the halogenized gas as etching gases.

For example, in an Al-film dry etching method with carbon tetrachloride or boron trichloride utilized as a reactive gas, chlorine is added for speeding up the etching speed, or hydrogen is added for improving the selection ratio of Al etching speed/resist etching speed. Additive gases for improving the etching speed or etching selectivity have a high activity as in the case in hydrogen, chlorine and hydrogen fluoride. Due to their explosive or injurious property, such gases are very dangerous and therefor inconvenient in view of operation as etching gases to be used in the rective ion etching gas method.

DISCLOSURE OF THE INVENTION

According to the present invention, there is used a usual reactive ion etching apparatus including a vacuum vessel, exhaust means, etching gas supply means, plasma generating electrodes, and a high frequency power supply. Inserted in the etching gas supply means is a substance having a catalystic action, by which the present invention is characterized.

According to the present invention, a catalyst having an action of dehydrogenation, dehydrohalogenation or dehalogenation dependent on the molecular construction of a halogenized gas to be used, is inserted in the etching gas supply means in the path thereof. The insertion of such catalyst enables the etching speed and the etching selectivity to be improved, without the use of explosive or injurious gases such as hydrogen, chlorine, hydrogen chloride, or hydrogen fluoride as additive gases.

BEST FORM TO PRACTICE THE PRESENT INVENTION

A description will now be made of one embodiment of the present invention with reference to the attached drawings.

In this embodiment, carbon tetrachloride is used as an etching gas for etching Al-films, and a metallic catalyst of palladium carried by a silica gel carrier is used as a substance having a catalytic action, in order to accelerate dechlorination.

Figure 1:
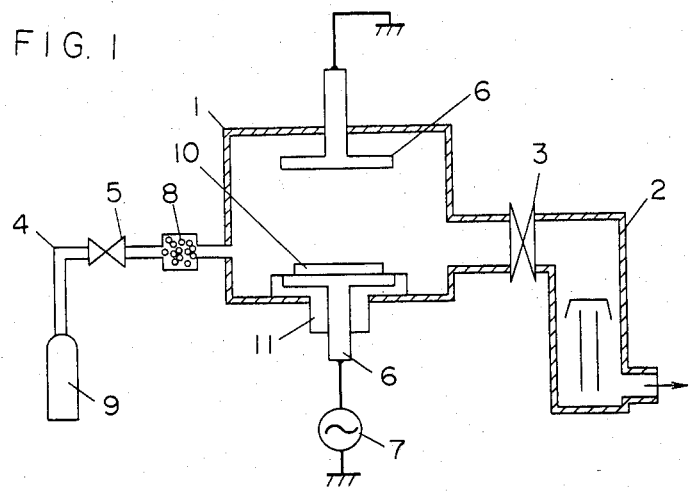
FIG. 1 is a schematic view of a reactive ion etching apparatus used in one embodiment of the present invention.

In FIG. 1, the reactive ion etching apparatus includes a vacuum vessel 1, exhaust means 2, a conductance valve 3, etching gas supply means 4, mass flow controller 5, plasma generating electrodes 6, a high frequency power supply 7, substance having a catalytic action 8, an etching gas 9, a workpiece to be etched 10 and an insulating spacer 11.

With reference to the reactive ion etching apparatus arranged as shown above, the description hereinafter will discuss the principle of the reactive ion etching method in accordance with the present invention.

The vacuum vessel 1 is exhausted and evacuated by the exhaust means 2 through the conductance valve 3. While an etching gas 9 (CCl$_4$) is introduced by the etching gas supply means 4 through the mass flow controller 5, the conductance valve 3 is adjusted to maintain constant gas pressure in the vacuum vessel 1. After having passed through the substance 8 (Pd on SiO$_2$) having a catalytic action, the etching gas 9 (CCl$_4$) is resolved into hexachloroethane (CCl$_3$-CCl$_3$) and chlorine (Cl$_2$) according to the reaction shown by the following formula No. 1, and then introduced into the vacuum vessel 1:

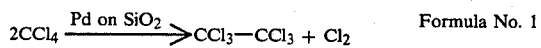

$$2CCl_4 \xrightarrow{\text{Pd on SiO}_2} CCl_3-CCl_3 + Cl_2 \quad \text{Formula No. 1}$$

A workpiece to be etched 10 is placed on one of the plasma generating electrodes. A high frequency electric power is applied to the plasma generating electrodes by the high frequency power supply 7. Due to a high frequency discharge, CCl$_4$, CCl$_3$-CCl$_3$ and Cl$_2$ in the vacuum vessel 1 are put in a plasma state in which the workpiece 10 is subjected to etching.

As thus discussed, the substance 8 (Pd on SiO$_2$) having a catalytic action with respect to the etching gas 9 (CCl$_4$) is inserted in the etching gas supply means 4 in the path thereof, so that the vacuum vessel 1 is put in a plasma state into which a mixed gas of CCl$_4$, CCl$_3$-CCl$_3$ and Cl$_2$ is being introduced. The etching speed and etching selectivity are then improved.

Figure 2:
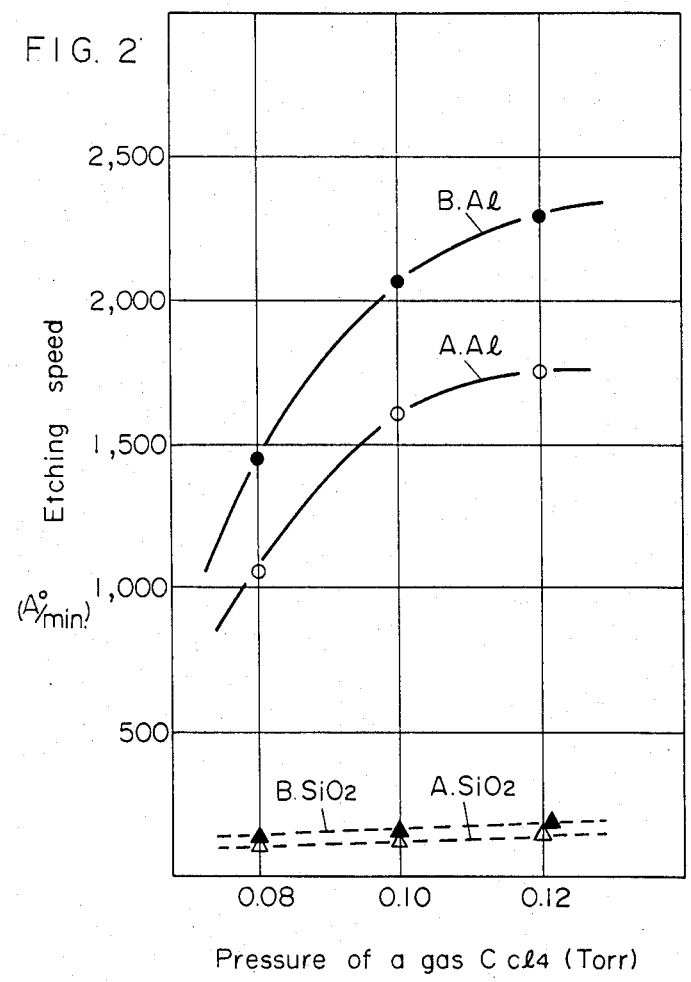
FIG. 2 is a graph showing how Al and SiO$_2$ etching speeds depend on the pressure of CCl$_4$ without and with a catalyst of Pd on SiO.

FIG. 2 shows how the present invention is effective, and represents the relationship between the etching speeds and the degree of vacuum with and without the substance 8 (Pd on SiO$_2$) having a catalytic action.

The following etching conditions were applied:
1. Etching gas: CCl$_4$
2. Flow amount of etching gas: 10 SCCM
3. High frequency electric power: 100 W (13.56 M 1/2)
4. Electrode distance: 25 mm Condition A: Without the use of catalyst
Condition B: With the use of catalyst of Pd on SiO$_2$ It is apparent from FIG. 2 that the Al etching speed and selectivity of Al etching speed/SiO$_2$ etching speed under Condition B are improved as compared with those under Condition A.

In the embodiment above-mentioned, there have been used the workpiece 10 of an Al film, the etching gas 9 of CCl$_4$ and the substance 8 having a catalystic action of Pd on SiO$_2$. The workpiece to be etched 10 may be either an inorganic substance or an organic substance, and the etching gas 9 may be any halogenized gas as far as it reacts to a workpiece dependent on the kind of such workpiece. For the substance having a catalytic action 8, there can be used any substance having a catalytic action such as dehydrogenation, dehydrohalogenation or dehalogenation, dependent on the molecular structure of a halogenized gas to be used.

While, in the embodiment discussed hereinbefore, the substance having a catalytic action 8 is Pd on SiO$_2$ having a structure in which a metallic catalyst has been carried by a solid acid-base catalyst carrier, either a metallic catalyst or a solid acid-base catalyst or a cracking catalyst may be used as far as it has a catalytic action of dehydrogenation, dehydrohalogenation or dehalogenation.

INDUSTRIAL UTILITY

According to the present invention a catalyst having an action of dehydrogenation, dehydrohalogenation or dehalogenation dependent on the molecular structure of an etching gas to be used, is inserted in an etching gas supply means in the path thereof, thereby to improve the etching speed and etching selectivity without the use of hydrogen, chlorine, hydrogen chloride or hydrogen fluoride. The present invention thus exhibits a great practical effect.

What is claimed is:

1. In a reactive ion etching method using a halogenized gas as a main composition of an etching gas with the use of a reactive ion etching apparatus including a vacuum vessel, exhaust means connected to said vacuum vessel, etching gas supply means, plasma generating electrodes disposed inside or outside of said vacuum vessel, and a high frequency power supply for supplying a high frequency electric power to said electrodes,
   said reactive ion etching method characterized in that a substance having a catalytic action is inserted in said etching gas supply means in the path thereof, and in that a catalyst for dehydrogenation is used as said substance having a catalytic action, when a halogenized gas containing hydrogen atoms is used as said main composition of the etching gas.

2. In a reactive ion etching method using a halogenized gas as a main composition of an etching gas with the use of a reactive ion etching apparatus including a vacuum vessel, exhaust means connected to said vacuum vessel, etching gas supply means, plasma generating electrodes disposed inside or outside of said vacuum vessel, and a high frequency power supply for supplying a high frequency electric power to said electrodes,
   said reactive ion etching method characterized in that a substance having a catalytic action is inserted in said etching gas supply means in the path thereof, and in that a catalyst for dehydrohalogenation is used as said substance having a catalytic action, when a halogenized gas containing hydrogen atoms is used as said main composition of the etching gas.

3. In a reactive ion etching method using a halogenized gas as a main composition of an etching gas with the use of a reactive ion etching apparatus including a vacuum vessel, exhaust means connected to said vacuum vessel, etching gas supply means, plasma generating electrodes disposed inside or outside of said vacuum vessel, and a high frequency power supply for supplying a high frequency electric power to said electrodes,
   said reactive ion etching method characterized in that a substance having a catalytic action is inserted in said etching gas supply means in the path thereof, and in that a catalyst for dehalogenation is used as said substance having a catalytic action, when a halogenized gas is used as said main composition of the etching gas.

4. In a reactive ion etching method using a halogenized gas as a main composition of an etching gas with the use of a rective ion etching apparatus including a vacuum vessel, exhaust means connected to said vacuum vessel, etching gas supply means, plasma generating electrodes disposed inside or outside of said vacuum vessel, and a high frequency power supply for supplying a high frequency electric power to said electrodes,
   said reactive ion etching method characterized in that a substance having a catalytic action is inserted in said etching gas supply means in the path thereof, and in that a cracking catalyst is used as said substance having a catalytic action, when a halogenized gas is used as said main composition of the etching gas.

5. A reactive ion etching method as set forth in claim 1, 2, 3 or 4 wherein a metallic catalyst is used as the substance having a catalytic action.

6. A reactive ion etching method as set forth in claim 1, 2, 3 or 4 wherein a solid acid-base catalyst is used as the substance having a catalytic action.

7. A reactive ion etching method as set forth in claim 1, 2, 3 or 4 wherein a catalyst in which a metallic catalyst is carried by a solid acid-base catalyst carrier, is used as the substance having a catalytic action.

* * * * *